United States Patent
Thomas

(10) Patent No.: US 10,838,023 B2
(45) Date of Patent: Nov. 17, 2020

(54) HIGH PERFORMANCE MAGNETIC RING AND SENSOR ARRANGEMENT

(71) Applicant: Aktiebolaget SKF, Gothenburg (SE)

(72) Inventor: Benedicte Thomas, Tours (FR)

(73) Assignee: Aktiebolaget SKF, Gothenburg (SE)

( * ) Notice: Subject to any disclaimer, the term of this patent is extended or adjusted under 35 U.S.C. 154(b) by 43 days.

(21) Appl. No.: 16/257,728

(22) Filed: Jan. 25, 2019

(65) Prior Publication Data
US 2020/0241086 A1    Jul. 30, 2020

(51) Int. Cl.
*G01R 33/07* (2006.01)
*G01D 5/14* (2006.01)

(52) U.S. Cl.
CPC .......... *G01R 33/072* (2013.01); *G01D 5/145* (2013.01)

(58) Field of Classification Search
CPC .............................. G01R 33/072; G01D 5/145
USPC ...................................................... 324/207.2
See application file for complete search history.

(56) References Cited

U.S. PATENT DOCUMENTS

| | | | |
|---|---|---|---|
| 2014/0062462 A1* | 3/2014 | McChrystal | A61M 1/122 324/207.2 |
| 2015/0137797 A1* | 5/2015 | Ausserlechner | G01D 3/08 324/207.2 |
| 2015/0253162 A1* | 9/2015 | Kusumi | G01D 5/244 324/207.12 |
| 2016/0161288 A1* | 6/2016 | Lu | G01D 5/145 324/207.2 |
| 2016/0258781 A1* | 9/2016 | Ausserlechner | G01D 3/08 |
| 2017/0276740 A1* | 9/2017 | Schmitt | G01D 5/24438 |

FOREIGN PATENT DOCUMENTS

| | | |
|---|---|---|
| FR | 3062947 A1 | 8/2018 |
| WO | 2011070391 A1 | 6/2011 |

* cited by examiner

*Primary Examiner* — Christopher P McAndrew
(74) *Attorney, Agent, or Firm* — Garcia-Zamor Intellectual Property Law; Ruy Garcia-Zamor; Bryan Peckjian

(57) ABSTRACT

A magnetic ring and sensor arrangement is provided. The magnetic ring and sensor arrangement includes a magnetic ring and a sensor sub-system. The magnetic ring includes an improved harmonic content. The sensor sub-system includes sensors coupled to the magnetic ring. Each of the sensors measure an amplitude or a direction of a magnetic field of the magnetic ring.

17 Claims, 5 Drawing Sheets

Table 310

| At nominal position | 6 pole pairs | | 8 pole pairs | |
|---|---|---|---|---|
| Average level [%] | H3 | H5 | H3 | H5 |
| Conventional ring | 23.7 | 6.8 | 17.2 | 3.5 |
| Improved ring | 5.3 | 1.2 | 7.6 | 0.7 |

Table 330

| Average angle error at sensor output [°] | 2 cells | | 3 cells | |
|---|---|---|---|---|
| | 6 pole pairs | 8 pole pairs | 6 pole pairs | 8 pole pairs |
| Conventional rings | 35.69 | 25.21 | 11.89 | 6.58 |
| Improved rings | 8.81 | 12.40 | 5.26 | 2.93 |
| Reduction [%] | 75.3 | 50.8 | 55.8 | 55.5 |

FIG. 3

HIGH PERFORMANCE MAGNETIC RING AND SENSOR ARRANGEMENT

BACKGROUND

For motor control using absolute position sensor (e.g., delivering an analogue sine and cosine denoting a rotor angular position), typically for gear motor generators, an accuracy requirement on sensor output signals is more and more important. Further, a machine torque needs to be properly controlled with the least amount of noises. The main source of sensor output inaccuracy is the magnetic ring itself. The magnetic ring does not provide a perfect image of the rotor angular position because the magnetic field signal delivered is not a perfect sine wave.

SUMMARY

In accordance with one or more embodiments, a magnetic ring and sensor arrangement is provided. The magnetic ring and sensor arrangement includes a magnetic ring and a sensor sub-system. The magnetic ring includes an improved harmonic content. The sensor sub-system includes sensors coupled to the magnetic ring. Each of the sensors measure an amplitude or a direction of a magnetic field of the magnetic ring.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter described herein is particularly pointed out and distinctly claimed in the claims at the conclusion of the specification. The foregoing and other features, and advantages of the embodiments herein are apparent from the following detailed description taken in conjunction with the accompanying drawings in which:

FIG. 3 depicts tables indicating improvements of a high performance magnetic ring over a conventional ring according to one or more embodiments;

DETAILED DESCRIPTION

Figure 1:
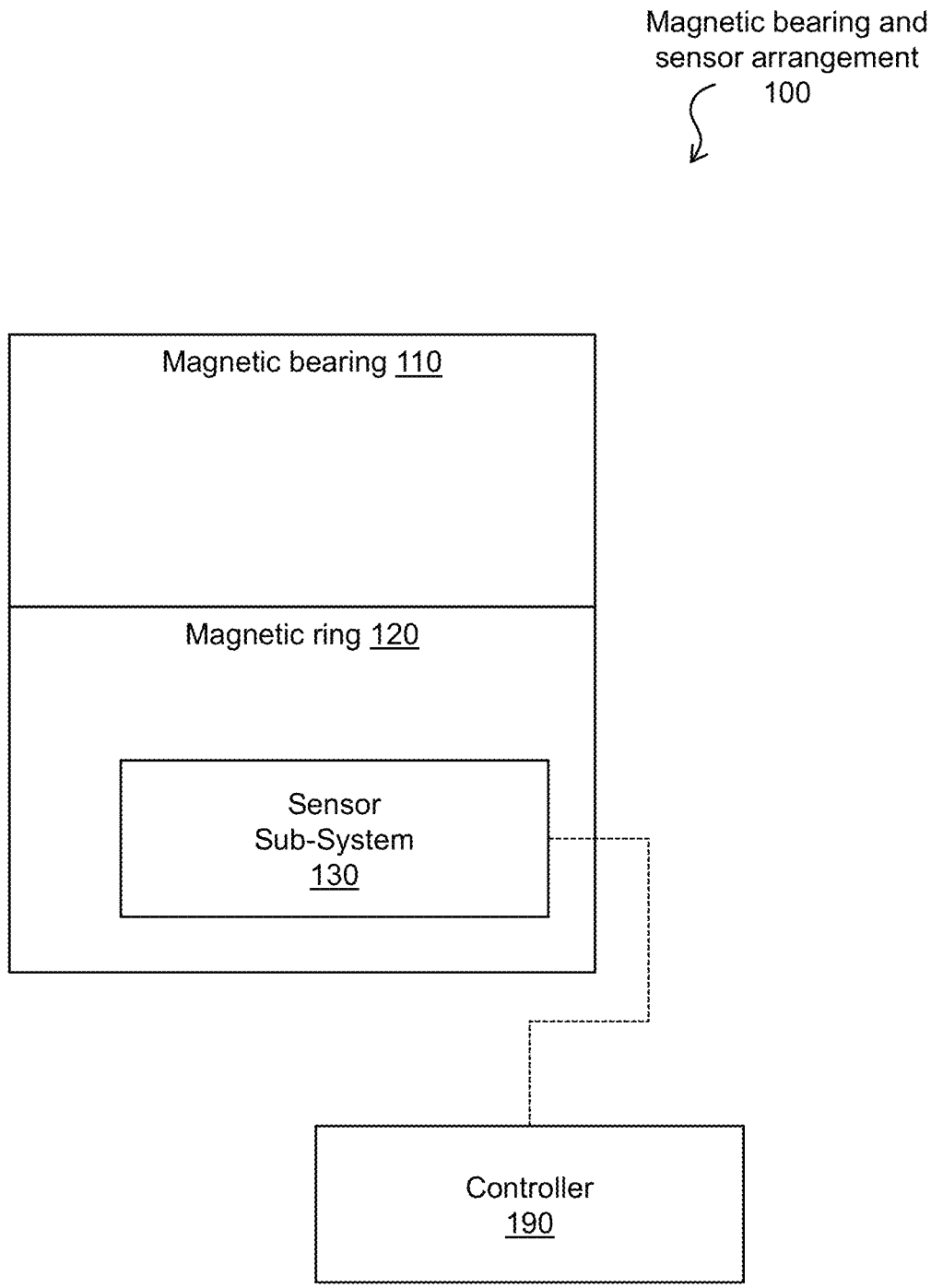
FIG. 1 depicts a magnetic ring and sensor arrangement according to one or more embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, as discussed above, software compensation, sensor placement, or Hall effect cells use may be employed on gear motor generators to compensate for the magnetic field signal respective to a magnetic ring of a gear motor generator failing to deliver a perfect sine wave.

Software compensation including a harmonic compensation algorithm attempts to remove the highest harmonics contained in sensor output signals. While software compensation is implemented at customer side (rather than a manufacturer side), an end of line calibration is added to calculate, for each sensor, the preponderant harmonics to compensate and then reach the required precision. This assumes that the angle error is repeatable over each mechanical period. Software compensation is complex and consumes calculation time and memory space in a controller. Thus, Software compensation requires more powerful and more expensive microcontrollers.

Sensor placement includes locating a sensor body further from the magnetic ring to capture an improved sine wave.

However, the further the sensor is from the magnetic ring, the more the sensor will be sensitive to external magnetic fields from the motor.

Hall effect cells may be added in front of the magnetic ring to reconstruct the sine/cosine signals with defined factors to average errors. But Hall effect cells are very expensive, and the more Hall effect cells that are added, the more expensive motor is.

Turning now to an overview of the aspects of the invention, one or more embodiments of the invention address the above-described shortcomings of the prior art by improving a performance of a magnetic ring in a motor as the magnetic ring is a main source of inaccuracy at a beginning of a sensor chain. That is, because the magnetic ring performance is improved, compensation for inaccuracies in the magnetic field signal is no longer required and expensive and/or problematic compensation solutions are avoided. In view of the above, embodiments disclosed herein may include a magnetic ring and sensor arrangement and/or a method of manufacturing the same.

Turning now to FIG. 1, a magnetic ring and sensor arrangement 100 is generally shown in accordance with one or more embodiments. The magnetic ring and sensor arrangement 100 includes a bearing 110, a magnetic ring 120, a sensor sub-system 130, and a controller 190.

The magnetic ring 120 includes an improved harmonic content and is, therefore, referred to as a high performance magnetic ring. In this regard, "high performance" implies the improved harmonic of the magnetic ring 120, which is defined as reducing one or more harmonics of the magnetic ring 120 to 10% or less (e.g., as shown in table 310 of FIG. 3). In accordance with one or more embodiments, a third harmonic and a fifth harmonic of the magnetic ring 120 are reduced accordingly. Further, the magnetic ring 120 includes a metallic insert that contains one single magnet with one or more pole pairs, which can be spaced/distributed evenly throughout the metallic insert. These magnets drive operations of the bearing 110 via a magnetic field. Examples of the magnetic ring 120 include, but are not limited to, internal magnets of a motor, external magnets to a motor, and a multipolar ring.

The sensor sub-system 130 can include one or more sensors coupled to the magnetic ring 120. The one or more sensors include any transducer, device, module, or system that detect events or changes in an environment and sends information in the form of a signal to other electronics (e.g., the controller 190). Examples of the one or more sensors include but are not limited to Hall effect and magnetoresistive (MR) sensors.

In accordance with one or more embodiments, the sensor sub-system 130 can include two or three Hall effect sensors, each of which measure the amplitude of a magnetic field of the magnetic ring 120 (e.g., an output voltage of the Hall effect sensor is directly proportional to a magnetic field strength through it), or one MR sensor with two active areas measuring the direction of a magnetic field.

Figure 4:
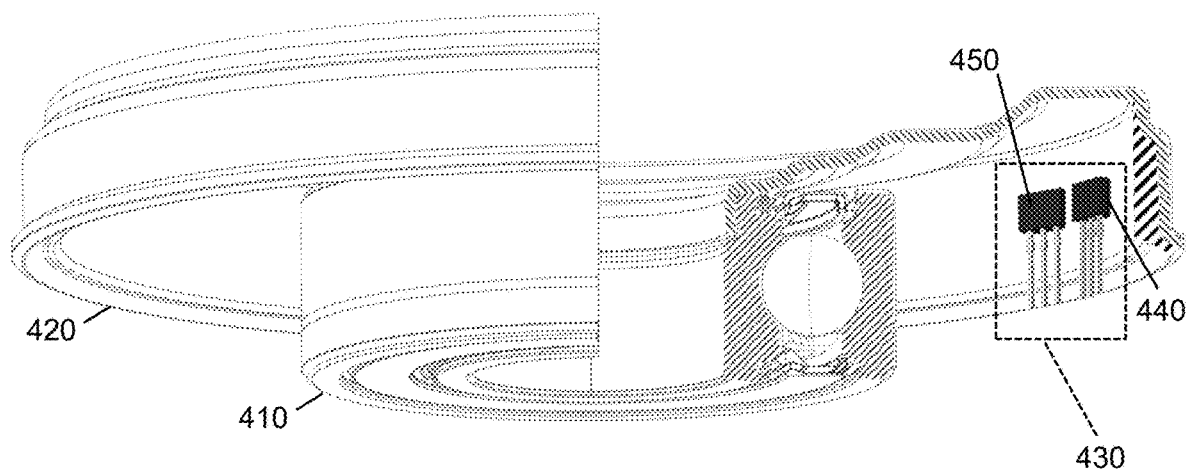
FIG. 4 depicts a schematic of a magnetic ring and sensor arrangement according to one or more embodiments.

For example, two sensors may be aligned on a pole pair (oriented with respect to corresponding magnetic poles) and utilized to generate sine/cosine signals (see FIG. 4). Note that, in this case, a 90 electrical degree phase shift can be present between the two sensors and, in turn, the signals. Further, three sensors may be aligned on a pole pair and utilized to generate sine/cosine signals (see FIG. 5). Note that, in this case, a 120 electrical degree phase shift can be present between the three sensors and, in turn, the signals. Also note that the three sensors may be configured for a suppression of a third harmonic (e.g., one of the most important harmonics coming from the magnetic ring).

The controller 190 is any processing device that can be store programmable code and drive the magnetic ring 120 and the sensor sub-system 130 via that programmable code, such as a field programmable array or processor. As shown in FIG. 1 by the doted lines, the controller 190 is electrically coupled to the sensor sub-system 130.

In accordance with one or more embodiment, the magnetic ring and sensor arrangement 100 can be implemented in any motor, such as a gear motor generator. In turn, the one or more sensors can be used for proximity sensing, positioning, speed detection, and current sensing applications, along with magnetic field detection of the magnetic ring 120.

Technical effects and benefits of the magnetic ring and sensor arrangement 100 include, but are not limited to, eliminating a need of software compensation, thereby saving space and calculation time saved in a controller; maintaining a sensor immunity level against external magnetic field while improving sensor performances; reducing a number of Hall effect cells to two; and no dimensional modification is needed for the magnetic ring.

Figure 2:
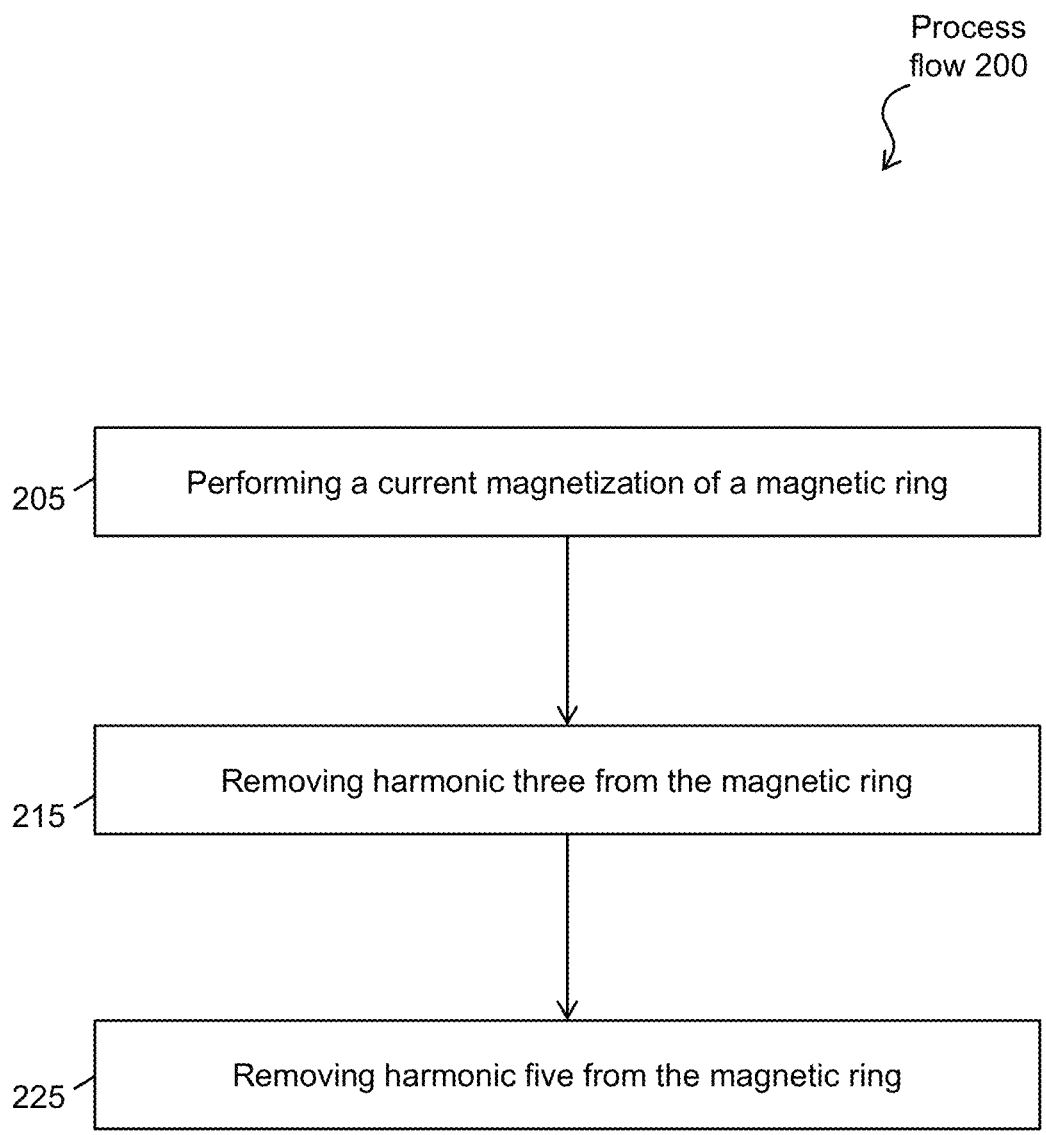
FIG. 2 depicts a process flow for magnetization of a high performance magnetic ring according to one or more embodiments.

Turning now to FIG. 2, a process flow 200 for removing harmonics of a magnetic ring to produce a high performance magnetic ring (e.g., magnetic ring 120) is generally shown in accordance with one or more embodiments. The process flow 200 begins at block 205, where a current magnetization of the magnetic ring is performed. A one-shot magnetization can be employed to perform the current magnetization. At block 215, a third harmonic is removed from the magnetic ring. A step-by-step magnetization can be employed to remove the third harmonic. At block 225, a fifth harmonic is removed from the magnetic ring to produce a high performance magnetic ring. A step-by-step magnetization can be employed to remove the fifth harmonic.

The resulting high performance magnetic ring of process flow 200 of FIG. 2 can be compared to a conventional ring. Particularly, FIG. 3 depicts tables 310 and 330 detailing improvements of the high performance magnetic ring of process flow 200 of FIG. 2 over a conventional ring. As shown in table 310 of FIG. 3, a level of preponderant harmonics is at least divided by two for the high performance magnetic ring (compared to the conventional ring), while keeping the same amplitude level, thereby avoiding expensive and/or problematic compensation solutions.

FIG. 4 depicts a schematic 400 of a magnetic ring and sensor arrangement according to one or more embodiments. The schematic 400 includes a bearing 410, a magnetic ring 420, a sensor 440, and a sensor 450. Depending on the precision needed, two sensors (e.g., sensors 440 and 450) can be used. Each sensor 440 and 450 may be placed on an interior surface of the magnetic ring 420. A benefit between 50% and 75% is observed on magnetic rings with 6 and 8 pole pairs (e.g., the high performance magnetic ring).

Figure 5:
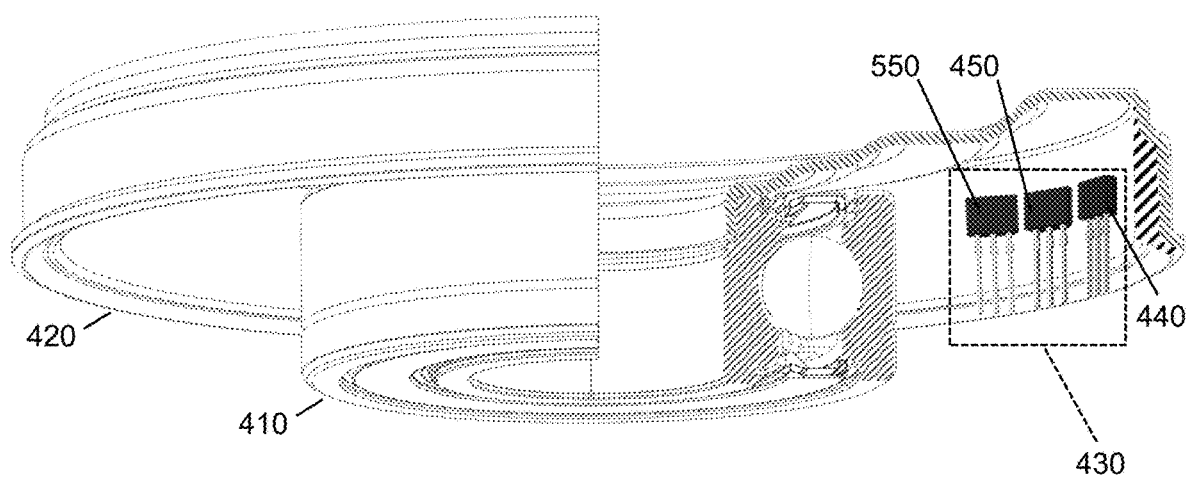
FIG. 5 depicts a schematic of a magnetic ring and sensor arrangement according to one or more embodiments.

FIG. 5 depicts a schematic 500 of a magnetic ring and sensor arrangement according to one or more embodiments. Elements of the schematic 500 that are similar to schematic 400 are reused for each of explanation. Thus, the schematic 500 further includes a sensor 550. Three sensors (e.g., sensors 440, 450, and 550) cells are used to capture the magnetic field. A decrease of the angle error of 55% can be observed on magnetic rings with 6 and 8 pole pairs (e.g., the high performance magnetic ring).

As shown in table 330 of FIG. 3, simulations have been performed to illustrate a benefit of using 2 or 3 sensors for the sensor sub-system 130 of FIG. 1 and as shown in schematic 500 of FIG. 5; thereby avoiding expensive and/or problematic compensation solutions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description but is only limited by the scope of the appended claims.

The invention claimed is:

1. A magnetic ring and sensor arrangement comprising:
a bearing having an outer ring;
a magnetic ring located around the outer ring comprising an improved harmonic content, wherein the improved harmonic content of the magnetic ring comprises a reduction of one or more harmonics of the magnetic ring such that the reduction of the one or more harmonics comprises a reduction to ten percent (10%) or less; and
   a sensor sub-system comprising one or more sensors coupled to the magnetic ring, each of which measure an amplitude or a direction of a magnetic field of the magnetic ring.

2. The magnetic ring and sensor arrangement of claim 1, wherein the one or more harmonics comprises a third harmonic and a fifth harmonic.

3. The magnetic ring and sensor arrangement of claim 1, wherein the one or more sensors comprise a magnetoresistive (MR) magnetic field sensor or a Hall effect sensor.

4. The magnetic ring and sensor arrangement of claim 1, wherein the one or more sensors comprise two or three sensors.

5. The magnetic ring and sensor arrangement of claim 1, wherein the one or more sensors comprise two sensors aligned on one pole pair of the magnetic ring, oriented with respect to corresponding magnetic poles, and utilized to generate sine/cosine signals respective to the magnetic field of the magnetic ring.

6. The magnetic ring and sensor arrangement of claim 1, wherein the one or more sensors comprise three sensors aligned on one pole pair of the magnetic ring and utilized to generate sine/cosine signals respective to the magnetic field of the magnetic ring.

7. The magnetic ring and sensor arrangement of claim 1, further comprising: a controller electrically coupled to and driving the sensor sub-system.

8. The magnetic ring and sensor arrangement of claim 1, wherein the magnetic ring further comprises a metallic insert having one single magnet with one or more pole pairs which are spaced evenly throughout the metallic insert.

9. The magnetic ring and sensor arrangement of claim 8, wherein the magnetic ring further comprises a metallic insert having one single magnet with six pole pairs which are spaced evenly throughout the metallic insert.

10. The magnetic ring and sensor arrangement of claim 8, wherein the magnetic ring further comprises a metallic insert having one single magnet with eight pole pairs which are spaced evenly throughout the metallic insert.

11. A magnetic ring and sensor arrangement comprising:
a bearing having an outer ring;
a magnetic ring located around the outer ring comprising an improved harmonic content, wherein the improved harmonic content of the magnetic ring comprises a reduction of one or more harmonics of the magnetic ring such that the reduction of the one or more harmonics comprises a reduction to ten percent (10%) or less;
   a sensor sub-system comprising one or more sensors coupled to the magnetic ring, each of which measure an amplitude or a direction of a magnetic field of the magnetic ring; and
   a controller electrically coupled to and driving the sensor sub-system, the controller being configured to store a programmable code, the controller driving the magnetic ring and the sensor sub system via the programmable code.

12. The magnetic ring and sensor arrangement of claim 11, wherein the magnetic ring further comprises a metallic insert having one single magnet with one or more pole pairs which are spaced evenly throughout the metallic insert.

13. The magnetic ring and sensor arrangement of claim 12, wherein the magnetic ring further comprises a metallic insert having one single magnet with six pole pairs which are spaced evenly throughout the metallic insert.

14. The magnetic ring and sensor arrangement of claim 12, wherein the magnetic ring further comprises a metallic insert having one single magnet with eight pole pairs which are spaced evenly throughout the metallic insert.

15. The magnetic ring and sensor arrangement of claim 11, wherein the one or more sensors comprise two sensors aligned on one pole pair of the magnetic ring, oriented with respect to corresponding magnetic poles, and utilized to generate sine/cosine signals respective to the magnetic field of the magnetic ring, wherein there is a ninety degree electrical phase shift between the two sensors and between the sine and cosine signals.

16. The magnetic ring and sensor arrangement of claim 11, wherein the one or more sensors comprise three sensors aligned on one pole pair of the magnetic ring and utilized to generate sine/cosine signals respective to the magnetic field of the magnetic ring, wherein the three sensors are configured for suppression of the third harmonic.

17. The magnetic ring and sensor arrangement of claim 11, wherein the one or more sensors comprise three sensors aligned on one pole pair of the magnetic ring and utilized to generate sine/cosine signals respective to the magnetic field of the magnetic ring, wherein the three sensors are configured for suppression of the third harmonic, wherein there is a one hundred twenty degree electrical phase shift between each of the three sensors.

* * * * *